United States Patent
Kim et al.

(10) Patent No.: US 10,032,795 B2
(45) Date of Patent: Jul. 24, 2018

(54) HARD COATING FILM AND DISPLAY DEVICE USING THE SAME

(71) Applicant: LG DISPLAY CO., LTD., Seoul (KR)

(72) Inventors: Keun Young Kim, Seoul (KR); Gee Sung Chae, Incheon (KR); In Byeong Kang, Goyang-si (KR); Kelly Sooyeun Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 387 days.

(21) Appl. No.: 14/549,206

(22) Filed: Nov. 20, 2014

(65) Prior Publication Data

US 2015/0179674 A1    Jun. 25, 2015

(30) Foreign Application Priority Data

Dec. 24, 2013  (KR) .................. 10-2013-0162110

(51) Int. Cl.
| | |
|---|---|
| *G02F 1/1335* | (2006.01) |
| *H01L 27/12* | (2006.01) |
| *H01L 51/52* | (2006.01) |
| *G02B 1/111* | (2015.01) |

(52) U.S. Cl.
CPC .......... *H01L 27/1214* (2013.01); *G02B 1/111* (2013.01); *G02F 1/133502* (2013.01); *H01L 51/5253* (2013.01); *H01L 51/5268* (2013.01); *H01L 51/5275* (2013.01); *H01L 2251/5369* (2013.01); *H01L 2924/0002* (2013.01); *Y10T 428/1045* (2015.01); *Y10T 428/1068* (2015.01)

(58) Field of Classification Search
CPC ......... H01L 2251/5369; H01L 27/1214; H01L 51/5253; H01L 51/5268; H01L 51/5275; G02B 1/111; G02F 1/133502; Y10T 428/1045; Y10T 428/1068
See application file for complete search history.

(56) References Cited

U.S. PATENT DOCUMENTS

| | | | | |
|---|---|---|---|---|
| 7,889,284 | B1 * | 2/2011 | Nemeth | G02F 1/13338 345/173 |
| 2006/0122351 | A1 * | 6/2006 | Laine | C08G 77/045 528/31 |
| 2007/0146887 | A1 * | 6/2007 | Ikeda | G02B 1/111 359/586 |
| 2009/0002832 | A1 * | 1/2009 | Tochigi | G02B 5/0226 359/599 |

(Continued)

FOREIGN PATENT DOCUMENTS

| | | |
|---|---|---|
| CN | 1869132 A | 11/2006 |
| CN | 101470216 A | 7/2009 |

(Continued)

OTHER PUBLICATIONS

Office Action of Chinese Patent Office in Appl'n No. 201410818256.3, dated Jun. 9, 2017.

*Primary Examiner* — Sophie Hon
(74) *Attorney, Agent, or Firm* — Dentons US LLP

(57) ABSTRACT

Disclosed is a display device that includes a display element including a plurality of thin film transistors; and a hard coating film on the display element, the hard coating film including: a base film; and a hard coating layer on the base film, the hard coating layer including a photo-curable resin composition and a plurality of porous particles.

15 Claims, 2 Drawing Sheets

(56) References Cited

U.S. PATENT DOCUMENTS

| | | | |
|---|---|---|---|
| 2010/0073611 A1* | 3/2010 | Tochigi | B29D 11/00865 |
| | | | 349/96 |
| 2010/0167019 A1* | 7/2010 | Ohyanagi | G02B 5/02 |
| | | | 428/172 |
| 2011/0164322 A1 | 7/2011 | Morozumi et al. | |
| 2014/0050909 A1* | 2/2014 | Choi | B32B 7/12 |
| | | | 428/217 |

FOREIGN PATENT DOCUMENTS

| | | | | |
|---|---|---|---|---|
| CN | 101765791 A | | 6/2010 | |
| CN | 102040903 A | | 5/2011 | |
| CN | 102189728 A | | 9/2011 | |
| CN | 102190956 A | | 9/2011 | |
| CN | 103299217 A | | 9/2013 | |
| JP | 2000329914 A | | 11/2000 | |
| JP | 2001026737 A | * | 1/2001 | |
| JP | 2005099778 A | | 4/2005 | |
| JP | 2005283611 A | | 10/2005 | |
| JP | 2005290368 A | | 10/2005 | |
| JP | 2005320418 A | * | 11/2005 | |
| TW | 201233552 A | | 8/2012 | |
| TW | 201336682 A | | 9/2013 | |
| WO | WO 2013111990 A1 | * | 8/2013 | B32B 7/12 |

* cited by examiner

HARD COATING FILM AND DISPLAY DEVICE USING THE SAME

This application claims the benefit of Korean Patent Application No. 10-2013-0162110, filed on Dec. 24, 2013, which is hereby incorporated by reference in its entirety for all purposes as if fully set forth herein.

BACKGROUND OF THE INVENTION

Field of the Invention

The present application relates to a hard coating film and a display device using the same, and more particularly, to a hard coating film and a display device using the same with improved scratch resistance, anti-reflection effect and/or fingerprint resistance and method for manufacturing the same.

Discussion of the Related Art

Nowadays, the display field has seen rapid development for visually representing an electrical information signal due to the wide spread of information society. In accordance therewith, a variety of flat panel display devices have been developed with such features as slimness, lightweight and low power consumption. Also, flat panel display devices have been rapidly replacing the existing cathode ray tubes (CRTs).

Examples of flat panel display devices are liquid crystal display (LCD) devices, organic light emitting display (OLED) devices, electrophoretic display (electric paper display (EPD)) devices, plasma display panel (PDPs) devices, field emission display (FED) devices, electroluminescence display (ELD) devices, elector-wetting display (EWD) devices, and so on.

Such a display device typically includes a hard coating film, in order to protect its surface and prevent a glaring phenomenon which is caused by external light irradiated onto its display screen. The hard coating film applied to the related art display device can provide an anti-reflective property. To this end, the hard coating layer includes ultra-fine protrusion patterns with a nano size that are obtained by prominently and depressively treating its surface. As such, the hard coating layer can use diffused reflections of the ultra-fine protrusion patterns with the nano-size.

However, manufacture cost for forming nano-sized patterns in the hard coating film is high. Also, an etching process is limited to selected materials, and it is thus difficult to apply the etching process to a variety of materials. Moreover, because the surface of the hard coating film is patterned, it is difficult to form the hard coating film with a high hardness. If the hardness is lowered, it is difficult for the hard coating film to protect the screen of the display device.

The hard coating film according to the related art can be prepared by stacking a plurality of coating layers. The plurality of coating layers can be formed by one of dry and wet methods.

In case of the dry method using vacuum equipment, a hard coating layer is formed on a base film before high and low refractive-index layers are formed with being overlapped with each other several times. A fingerprint resistant coating layer, which has a fingerprint resistant property, can also be formed on the hard coating film already provided with the plurality of coating layers as needed.

When the hard coating film according to the related art is manufactured with the dry method, multiple layer formation processes must be thus performed to form the plurality of coating layers. Due to this, the manufacture cost of the hard coating film largely increases, the manufacture procedure of the hard coating film becomes complicated, and productivity of the hard coating film deteriorates. For example, in order to manufacture the hard coating film according to the related art using the dry method, six layers may be sequentially formed one by one, requiring multiple deposition or coating processes. Due to this, the manufacture procedure for the hard coating film is very complicated, the quantity and size of the base film are limited depending on the used vacuum equipment, and process time is lengthened.

In case of the wet method such as a dip or roll coating method, a hard coating layer and a low refractive-index layer are sequentially formed on a base film. In other words, at least two layers including the hard coating layer must be formed on the base film. Similar to the dry method, a fingerprint resistant coating layer, which has a fingerprint resistant property, can also be formed on the hard coating film already provided with the plurality of coating layers as needed.

The wet method for manufacturing the hard coating film according to the related art relatively may weaken an adhesion force between the low refractive-index layer and the hard coating layer. Also, the low refractive-index layer may have a low hardness due to material properties. In other words, the wet method may make the combination of resin compositions forming the hard coating layer and the low refractive-index layer become poor. As such, the low refractive-index layer and the hard coating layer may be easily separated from each other.

SUMMARY OF THE INVENTION

Accordingly, the present application is directed to a hard coating film and a display device using the same and method for manufacturing the same that substantially obviates one or more of problems due to the limitations and disadvantages of the related art, and to a display device using the same.

An advantage of the present invention is to provide a hard coating film and a display device using the same with improved scratch resistance, anti-reflection effect and/or fingerprint resistance and method for manufacturing the same.

Another advantage of the present invention is to provide a hard coating film and a display device using the same with simplified fabrication procedure and reduced process time and cost.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include a display element including a plurality of thin film transistors; and a hard coating film on the display element, the hard coating film including: a base film; and a hard coating layer on the base film, the hard coating layer including a photo-curable resin composition and a plurality of porous particles.

A hard coating film according to another general aspect of the present embodiment includes: a base film; and a hard coating layer disposed on the base film and formed in a single layer which includes a photo-curable resin composition and porous particles.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 1:
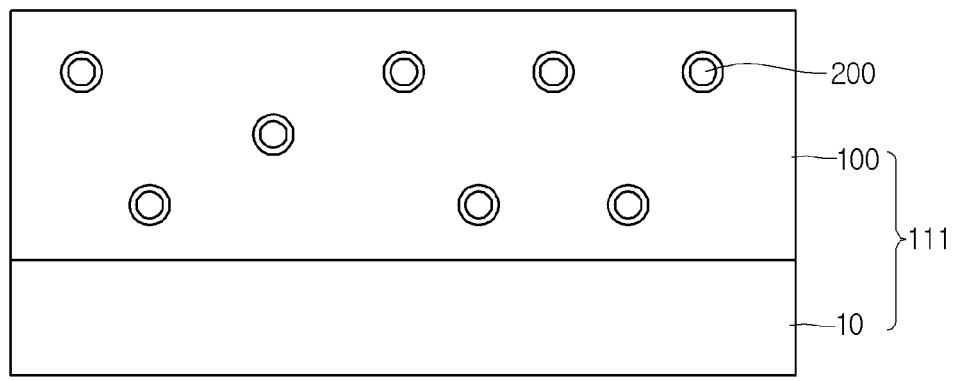
FIG. 1 is a cross-sectional view illustrating a hard coating film according to an embodiment of the present invention.

FIG. 1 is a cross-sectional view illustrating a hard coating film according to an embodiment of the present invention.

Referring to FIG. 1, a hard coating film 111 includes a base film 10 and a hard coating layer 100 formed on the base film 10. The base film 10 can be formed from one selected from a material group which includes a cellulose esters (such as cellulose triacetate, cellulose propionate, cellulose butyrate, cellulose acetate propionate and nitrocellulose), polyimide, polycarbonate, polyesters (such as polyethylene terephthalate, polyethylene naphthalate, poly-1,4-cyclohexanedimethylane terephthalate, polyethylene 1,2-diphenoxyethane-4,4'-dicarboxylate and polybutylene terephthalate), a polystylene (such as syndiotactic polystylene), polyolefines (such as polypropylene, polyethylene and polymethylpentene), polysulfone, polyether sulfone, polyarylate, polyether-imide, polymethyl methacrylate, polyether ketone, polyvinyl alcohol, polyvinyl chloride and compounds thereof. However, the base film 100 is not limited to these examples. In other words, a variety of different types of films can be used for the base film 100, so long as their transparency is not severely compromised. Although the base film is formed in a single-layer structure in the drawings, it can be formed in a multi-layered structure. In other words, the structure and formation material of the base film 10 can be selectively modified and changed depending on the display device to which the hard coating film is applied.

The hard coating layer 100 disposed on the base film 10 is formed in a single-layer structure. The hard coating layer 100 with the single-layer structure may have a thickness in a range of about 5 μm to about 15 μm.

The hard coating layer 100 can be formed to include a photo-curable resin composition and porous particles 200. The hard coating layer 100 can further include a photo-polymerization initiator and an acrylic monomer. Also, when the hard coating layer 100 needs to have a fingerprint resistant property, a fingerprint resistant additive can further be included into the hard coating layer 100. Such a hard coating layer 100 can allow the hard coating film disposed on a surface of a display device to have an anti-reflection property. In detail, the porous particles 200 of the hard coating layer 100 can allow the hard coating film 111 to have an anti-reflection property.

The photo-curable resin composition can include a cage-type silsesquioxane resin with a photo-curable property. The cage-type silsesquioxane resin can allow the hard coating layer 100 to be formed in a high hardness. Such a cage-type silsesquioxane resin can be represented by Chemical Formula 1.

$$[R_1\text{—}SiO_{3/2}]_n \qquad \text{[Chemical Formula 1]}$$

In Chemical Formula 1, the 'n' is one of integers from 6 to 18. Preferably, 'n' is set to 12. The cage-type silsesquioxane resin can be formed in a hexagonal structure as represented by the following Chemical Formula 2.

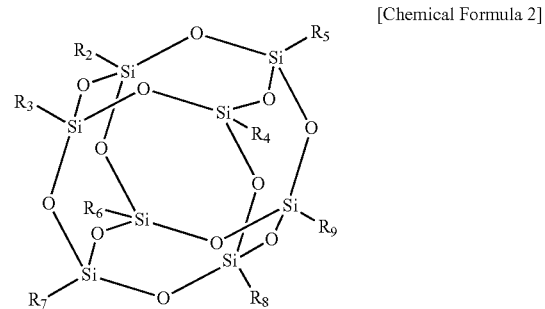

[Chemical Formula 2]

In the chemical formulas 1 and 2, 'R1' through 'R9' each include any one selected from materials which are represented by the following chemical formulas 3 through 6.

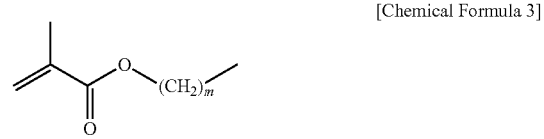

[Chemical Formula 3]

[Chemical Formula 4]

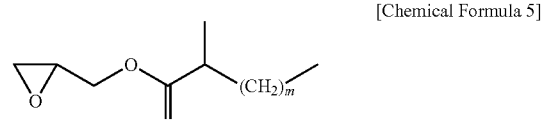

[Chemical Formula 5]

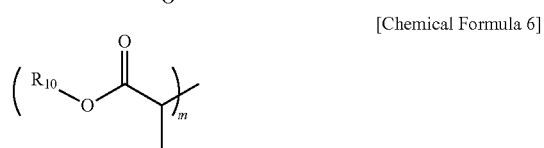

[Chemical Formula 6]

In the chemical formulas 3 through 6, 'm' is one of integers from 1 to 20 and 'R10' becomes any one of aliphatic and aromatic hydrocarbons each having the number of carbon atoms corresponding to 1 to 80.

The photo-curable resin composition in a liquid phase can be coated by a coating apparatus. In order to coat the photo-curable resin composition, any one of well-known coating methods can be used. Also, the photo-curable resin composition can be included into the hard coating layer 100 by about 5 to about 95 wt %, when the hard coating layer 100 corresponds to 100 wt %.

About 5 to about 95 wt % of the photo-curable resin composition has superior compatibility and coating property. As such, about 5 to about 95 wt % of the photo-curable resin composition can allow the hard coating layer 100 to be formed in a pencil hardness of about 6H to about 9H. The pencil hardness can be obtained by placing a sample of a fabricated hard coating layer 100 under a temperature of about 25° C. and a relative humidity of about 60% for two hours and then measuring the pencil hardness of the sample using a testing pencil regulated in JIS S 6006 datasheet according to a pencil hardness testing method regulated in JIS K 5400 datasheet. In other words, the hard coating layer 100 can be formed in a high hardness using the photo-curable resin composition.

Figure 2:
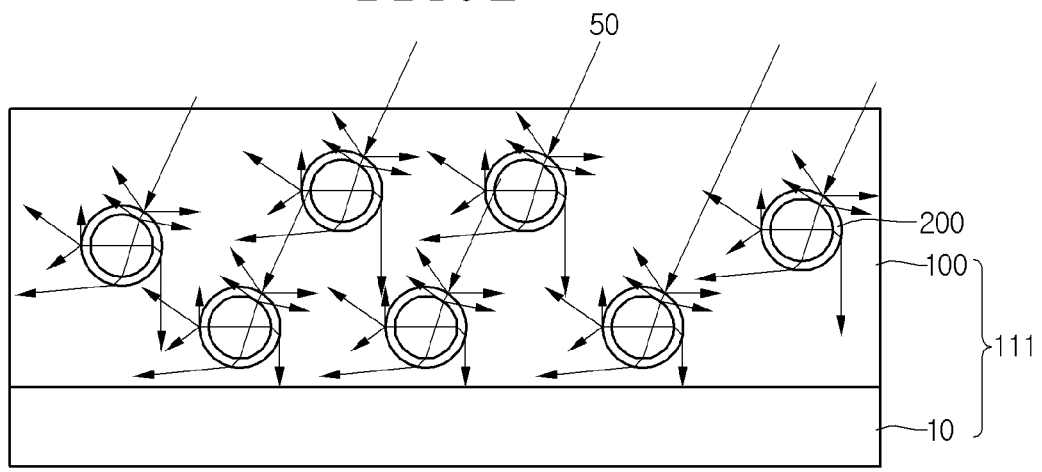
FIG. 2 is a cross-sectional view illustrating paths of incident light within a hard coating film according to an embodiment of the present invention.

FIG. 2 is a cross-sectional view illustrating paths of incident light within a hard coating film according to an embodiment of the present disclosure.

As illustrated in FIG. 2, some of the light entering the porous particle 200 is reflected and refracted at the outer surface of the porous particle 200, and some penetrates through the porous particle 200. As such, the light entering the porous particle 200 can be diffusively reflected. Therefore, an anti-reflection property of the hard coating film 111 can be enhanced.

The porous particles 200 can become porous polymer particles. The porous particle 200 may have an empty space with air in its inside. In other words, the porous particle 200 with the empty space can allow light to be reflected and refracted by and penetrate through its inner and outer surfaces. In accordance therewith, the anti-reflection property of the hard coating film 111 can be enhanced.

Such a porous particle can be formed from polystyrene, polyethylene, polypropylene, or others, but it is not limited to these examples. Alternatively, any materials adapted to form the porous particle 200 can be used. If the porous particle 200 has an outer diameter above about 30 nm, a haze may be generated due to a diffused reflection. It is thus preferable to form the porous particle 200 with an outer diameter in a range of about 1 nm to about 30 nm.

Table 1 below shows experiment resultants for the hard coating film 111 according to embodiments of the present invention. The experiment results include compatibilities, coating properties, reflectances and pencil hardnesses of the hard coating film 111 depending on the content of the porous particles 200 when 80 wt % of photo-curable resin composition is included into the hard coating layer 100.

TABLE 1

| Processing rate of porous particles | Contend (wt %) | Compatibility | Coating property | Reflectance (%) | Pencil hardness (H) |
| --- | --- | --- | --- | --- | --- |
| 55% | 0.1 | ○ | ○ | 5.0 | 9H |
|  | 0.2 | ○ | ○ | 4.2 | 9H |
|  | 0.5 | ○ | ○ | 3.8 | 9H |
|  | 0.8 | ○ | ○ | 3.2 | 9H |
|  | 1.0 | ○ | ○ | 2.8 | 9H |

TABLE 1-continued

| Processing rate of porous particles | Contend (wt %) | Compatibility | Coating property | Reflectance (%) | Pencil hardness (H) |
| --- | --- | --- | --- | --- | --- |
|  | 1.5 | ○ | ○ | 2.7 | 9H |
|  | 2.0 | Δ | ○ | 2.3 | 9H |
| 30% | 0.1 | ○ | ○ | 5.0 | 9H |
|  | 0.2 | ○ | ○ | 4.9 | 9H |
|  | 0.5 | ○ | ○ | 4.3 | 9H |
|  | 0.8 | ○ | ○ | 3.8 | 9H |
|  | 1.0 | ○ | ○ | 3.3 | 9H |
|  | 1.5 | Δ | ○ | 3.0 | 9H |
|  | 2.0 | Δ | ○ | 2.7 | 9H |

As shown in Table 1, the reflectance of the hard coating film 111 is no more than 5%, and the compatibility and the coating property of the hard coating film 111 is favorably obtained when the porous particles 200 are included by about 0.2 to about 2.0 wt %. Also, it is beneficial to adjust the content of the porous particles 200 so that the hard coating film 111 has a reflectance below about 4%.

The hard coating film according to the related art has a plurality of layers in order to satisfy required reflectance. Also, the hard coating film according to the related art typically further includes a plurality of high refractive-index layers and a plurality of low refractive-index layers, which are repeatedly stacked on the hard coating layer, using a dry method, or a low refractive-index layer formed on the hard coating layer using a wet method. Due to this, the manufacture procedure of the hard coating film according to the related art may be complicated. The dry method may limit the number and size of films and require a lengthened process time for forming the hard coating film. Also, the wet method may weaken an adhesion force between the low refractive-index layer and the hard coating layer and force the low refractive-index layer to be easily peeled from the hard coating layer.

On the other hand, the hard coating film 111 according to an embodiment of the present invention may obtain a desired reflectance without stacking the plurality of layers because the porous particles 200 are included into the hard coating layer 100. Also, the hard coating film 111 may simplify its manufacture process and reduce its process time and cost by forming the hard coating layer 100 in a single-layer structure. Moreover, the hard coating film 111 may obtain superior scratch resistance and anti-reflection effect because the hard coating layer includes the porous particles 200.

The fingerprint resistant additive can be included into the hard coating layer 100 when the hard coating film 111 needs to secure a fingerprint resistant property. Because the hard coating layer 100 can include the fingerprint resistant additive, the hard coating film 111 may not require any additional fingerprint prevention layer.

Also, chain type siloxane acrylate can be included into the fingerprint resistant additive. Preferably, the fingerprint resistant additive includes a compound which is represented by the following chemical formula 7.

[Chemical Formula 7]

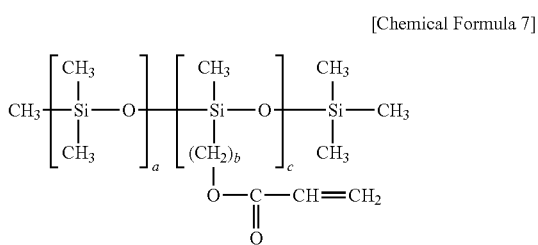

In Chemical Formula 7, the 'a' is one of integers of 0 to 1000, the is one of integers of 1 to 30, and the 'c' is one of integers of 1 to 25. The fingerprint resistant additive can be included into the hard coating layer by about 1 to about 5 wt %, compared to 100 wt % of the hard coating layer.

In order to protect the display device, the hard coating film of the related art needs a functional layer having a water repellent property, which allows a water-drop stained on the hard coating film to run down without being absorbed into the display device, and a fingerprint resistant property, which reduce or prevent any fingerprint from being stained on the display device. However, the hard coating film 111 according to an embodiment of the present invention can be formed in a single-layer structure by having the hard coating layer 100 that includes the fingerprint resistant additive. As such, an additional fingerprint prevention layer can be omitted. In accordance therewith, the manufacture procedure of the hard coating film 111 can be simplified, and the process time and cost of the hard coating film 111 can be reduced.

As the photo polymerization initiator, every photo polymerization initiator generally applied to the art can used without any limitation. For example, the photo polymerization initiator can include at least one selected from a material group which includes a hydroxy ketone-based photo polymerization initiator, an amino ketone-based photo polymerization initiator and a hydrogen abstraction type photo polymerization initiator.

More specifically, the photo polymerization initiation can include at least one selected from a material group which includes 2-methyl-1-[4-(methylthio)phenyl]-2-mopholinepropanone-1, diphenylketonebenzyldimethylketal, 2-hydroxy-2-methyl-1-phenyl-1-one, 4-hydroxycyclophenylketone, dimethoxy-2-phenylacetophenone, anthraquinone, fluorene, triphenylamine, carbazole, 3-methylacetonephenone, 4-chloroacetophenone, 4,4-dimethoxyacetophenone, 4,4-diaminobenzophenone, 1-hydroxycyclohexylphenylketone, benzophenone and so on. However, the present invention is not limited to the above-mentioned photo polymerization initiators. In other words, any one of known photo polymerization initiators can be used.

The photo polymerization initiator can be included into the hard coating layer 100 by about 0.1 to about 10 wt %. When the content of the photo polymerization initiator is no more than about 0.1 wt %, the photo-curable resin composition of the hard coating layer 100 is slowly hardened. On the contrary, when the content of the photo polymerization initiator is not less than about 10 wt %, the photo-curable resin composition is over hardened, which may generate a crack in the hard coating layer 100.

The acrylic monomer can be a (meth)acrylate monomer. The acrylic monomer can be included in the hard coating layer 100, in order to enhance the hardness and the curling properties of the hard coating layer 100.

Such an acrylic monomer can include at least one selected from a material group which consists of dipentaerythritolpenta/hexa(meth)acrylate, pentaerythritoltri/tetra(meth)acrylate, ditrimethylolpropanetetra(meth)acrylate, (meth)acrylicester, trimethylolpropanetri(meth)acrylate, glycerol tri(meth)acrylate, tris(2-hydroxyethyl)isocyanurate, tri(meth)acrylate, ethyleneglycoldi(meth)acrylate, propyleneglycol(meth)acrylate, 1,3-butanedioldi(meth)acrylate, 1,4-butanedioldi(meth)acrylate, 1,6-hexanedioldi(meth)acrylate, neopentylglycoldi(meth)acrylate, diethyleneglycoldi(meth)acrylate, triethyleneglycoldi(meth)acrylate, dipropyleneglycoldi(meth)acrylate, bis(2-hydroxyethyl)isocyanuratedi(meth)acrylate, hydroxyethyl(meth)acrylate, hydroxypropyl(meth)acrylate, hydroxylbutyl(meth)acrylate, isooctyl(meth)acrylate, isodecyl(meth)acrylate, stearyl(meth)acrylate, tetrahydrofurfuryl(meth)acrylate, phenoxyethyl(meth)acrylate, isoborneol(meth)acrylate and so on. However, the acrylic monomer according to the present disclosure is not limited to these examples. In other words, any one of acrylic monomers that are generally used in the art, can be used without any limitation.

The acrylic monomer is preferably included into hard coating layer 100 by the rest of the content that excludes the photo-curable resin composition, the porous particles 200, the fingerprint resistant additive and the photo polymerization initiator from the hard coating layer 100.

Figure 3:
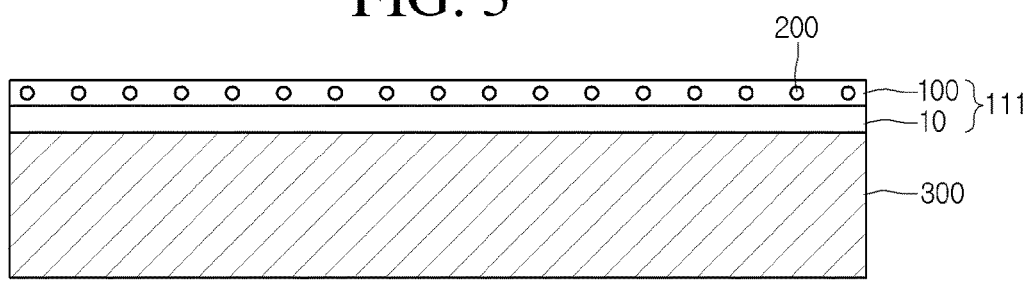
FIG. 3 is a cross-sectional view illustrating a display device according to the first embodiment of the present invention.

FIG. 3 is a cross-sectional view illustrating a display device according to the first embodiment of the present invention. The display device of the first embodiment includes the same components as those of the embodiment illustrated in FIGS. 1 and 2. As such, the overlapping description may be omitted. Also, components of the display device of the first embodiment having the same or similar function and shape as those of the embodiment illustrated in FIGS. 1 and 2 may be referred to by the same reference numbers and names.

Referring to FIG. 3, the display device according to the first embodiment of the present disclosure includes a display element 300 and a hard coating film 111 disposed on at least one surface of the display element 300. The display element 300 can include thin film transistors and be driven by the thin film transistors. The hard coating film 111 can be the same as that described in FIGS. 1 and 2.

The display device is generally used to display images. Examples of the display device are an LCD device, an OLED device, an electrophoretic display device (EPD device), a PDP device, an FED device, an ELD device, an EWD device and so on. For example, the display device 300 of the first embodiment can be either an LCD device and an OLED device.

When the display element 300 is an LCD device, the LCD device includes lower and upper substrates which are separated from each other by a fixed distance and combined with each other. Also, the LCD device includes a liquid crystal layer between the lower and upper substrates. The lower substrate can be a thin film transistor substrate, and the upper substrate can be a color filter substrate.

Gate lines and data lines, which cross each other with having a gate insulation film therebetween and define pixel regions, are formed on the lower substrate. The thin film transistors each including a gate electrode, the gate insulation film, a semiconductor layer, a source electrode and a drain electrode are formed at crossings of the gate and data lines. Also, pixel electrodes each being in contact with the respective thin film transistor are formed on the lower substrate.

On the other hand, a black matrix with a lattice shape and color filters are formed on the upper substrate. Also, an overcoat layer covering the black matrix and the color filters can be formed on the upper substrate.

Alternatively, the LCD device can be manufactured in a COT (color filter on transistor) structure which allows the color filters and the black matrix to be formed on the lower substrate.

Such an LCD device is not a self-luminous element. Due to this, the LCD device further includes a backlight unit disposed on the rear surface of the lower substrate.

The LCD device is not limited to the above-mentioned structures. In other words, when the display element 300 according to an embodiment of the present invention is an LCD device, various types of LCD devices known in the art can be applied to the display device.

When the display element 300 is an OLED device, the OLED device includes thin film transistors, each of which has a gate electrode, a semiconductor layer and source/drain electrodes, and an organic light emitting diodes being in electrical contact with the drain electrode of the respective thin film transistor. The organic light emitting diode includes an anode electrode, an organic material layer with at least one emission layer, and a cathode electrode.

The organic light emitting diode allows holes supplied from the anode electrode and electrons injected from the cathode electrode to be drifted to and recombined in the organic material layer, when a fixed voltage in accordance with a selected pixel signal is applied to between the anode and cathode electrodes, thereby generating excitons. Also, the organic light emitting diode can emit a visible light when the excitons are transitioned from an excited state into a lower energy state. Such an OLED element is a self-luminous element, and thus, the OLED device typically does not require any additional light source.

In order to reduce or prevent the intrusion of oxygen and/or moisture into the organic light emitting diode, the OLED device can further include a sealing member, which may have a variety of different shapes and is generally known in the art, such as a plurality of sealing layers, a sealing substrate and so on.

The OLED device is not limited to the above-mentioned structures. In other words, when the display device 300 is an OLED device, various types of OLED devices known in the art can be applied to the display device 300.

Although it is not shown in the drawings, an adhesive layer can be formed between the display element 300 and the hard coating film 111. For example, the adhesive layer can be formed from one of an acrylic adhesive, an ultraviolet curing adhesive, a thermal curing adhesive and so on. However, the adhesive layer is not limited to these examples. In other words, any adhesive layer generally known in the art can be used without any limitation.

Figure 4:
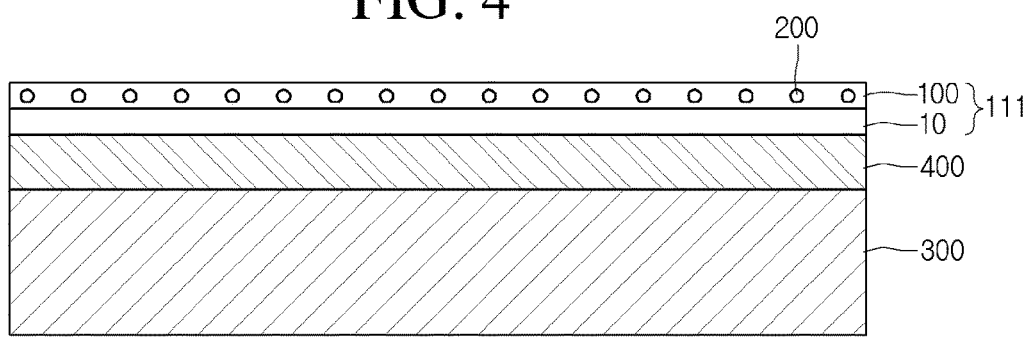
FIG. 4 is a cross-sectional view illustrating a display device according to the second embodiment of the present invention.

FIG. 4 is a cross-sectional view illustrating a display device according to the second embodiment of the present invention. The display device according to the second embodiment can have the same configuration as that of the above-mentioned first embodiment, with the exception of a touch panel. As such, the description of the second embodiment overlapping with the above-mentioned first embodiment may be omitted. Also, components of the second embodiment having the same or similar function and shape as those of the above-mentioned first embodiment may be referred to by the same reference numbers and names.

Referring to FIG. 4, the display device according to the second embodiment includes a display element 300, a touch panel 400 disposed on the display element 300, and a hard coating film 111 disposed on the touch panel 400. The display element 300 can include thin film transistors and be driven by the thin film transistors, similar to the first embodiment. The hard coating film 111 can be the same as that described in FIGS. 1 and 2.

Various types or shapes (or structures) of touch panels can be applied to the touch panel 400 that is provided on the display element 300 as illustrated in FIG. 4. For example, the touch panel 400 can be one of an add-on-type touch panel and an integrated-type touch panel. Also, the add-on-type touch panel can be one of an one-cell type touch panel and an in-cell type touch panel, both of which are integrated with the display element 300 in a single body. In other words, various types of touch panels generally known in the art can be used without any limitation.

In this manner, a hard coating film according to an embodiment of the present invention may include a hard coating layer that is beneficially formed in a single layer with a plurality of porous particles. Also, a hard coating film according to an embodiment of the present invention may have a fingerprint resistant property and thus may not need a separate and additional a fingerprint resistant coating layer. Such a hard coating layer, which includes a plurality of porous particles, may also enhance an anti-reflection property of the hard coating film. Such a hard coating layer may be formed in a single layer, which may allow not only the manufacture procedure of the hard coating film to be simplified but also the process time and cost of the hard coating film to be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
 a display element including a plurality of thin film transistors; and
 a hard coating film on the display element, the hard coating film including:
  a base film; and
  a hard coating layer having a single-layer structure on the base film, the hard coating layer including a photo-curable resin composition and a plurality of porous particles which are formed from polyethylene or polypropylene,
 wherein the plurality of porous particles have an outer diameter in a range of about 1 nm to about 30 nm,
 wherein the photocurable resin composition comprises a cage type silsesquioxane resin,
 wherein the cage type silsesquioxane resin includes a compound represented by Chemical Formula 1:

$[R_1—SiO_{3/2}]_n$           [Chemical Formula 1]

wherein the 'n' is one of integers of 6 to 18 and the '$R_1$' is one selected from materials which are represented by Chemical Formula 2 to Chemical Formula 5;

[Chemical Formula 2]

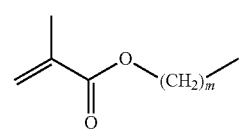

[Chemical Formula 3]

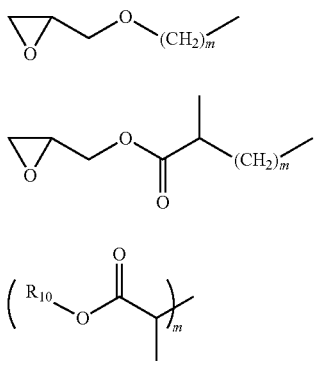

[Chemical Formula 4]

[Chemical Formula 5]

wherein the 'm' is one of integers of 1 to 20 and the 'R$_{10}$' becomes any one of aliphatic and aromatic hydrocarbons each having a number of carbon atoms corresponding to 1 to 80, and wherein the cage type silsesquioxane resin includes cage type silsesquioxane resin formed in a hexagonal structure including a compound represented by the Chemical Formula 1 in which the 'n' is 12.

2. The display device of claim 1, wherein the cage type silsesquioxane resin is included into the photo-curable resin composition by about 5 to about 95 wt %.

3. The display device of claim 1, wherein the plurality of porous particles are included into the hard coating layer by about 0.2 to about 3.0 wt %.

4. The display device of claim 3, wherein the hard coating layer has a reflectance below about 4%.

5. The display device of claim 1, wherein the hard coating layer further includes a fingerprint resistant additive.

6. The display device of claim 5, wherein the fingerprint resistant additive is included into the hard coating layer by about 1 to about 5 wt %.

7. The display device of claim 5, wherein the fingerprint resistant additive includes a chain type siloxane acrylate.

8. The display device of claim 5, wherein the fingerprint resistant additive includes a compound represented by Chemical Formula 7:

[Chemical Formula 7]

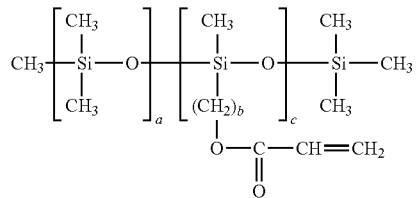

wherein the 'a' is one of integers of 0 to 1000, the 'b' is one of integers of 1 to 30 and the 'c' is one of integers of 1 to 25.

9. The display device of claim 1, wherein the hard coating layer further includes a photo polymerization initiator.

10. The display device of claim 1, wherein hard coating layer further includes an acrylic monomer.

11. The display device of claim 1, wherein the hard coating film has a thickness in a range of about 5 μm to about 150 μm.

12. The display device of claim 1, further comprises a touch panel between the display element and the hard coating film.

13. The display device of claim 1, wherein the display element is a liquid crystal display element or an organic light emitting display element.

14. The display device of claim 1, wherein the plurality of porous particles have an empty space with air in their inside.

15. The display device of claim 1, wherein R$_1$ is selected from materials which are represented by Chemical Formula 4 and Chemical Formula 5:

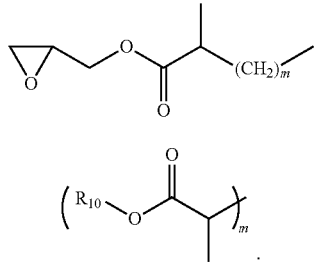

* * * * *